United States Patent [19]

Gignac et al.

[11] Patent Number: 4,753,598

[45] Date of Patent: Jun. 28, 1988

[54] PIVOTING ELECTRICAL CONTACT

[75] Inventors: Ivan J. Gignac, Scottsdale; Earl J. Fleck, Mesa, both of Ariz.

[73] Assignee: ASM America, Inc., Phoenix, Ariz.

[21] Appl. No.: 69,812

[22] Filed: Jul. 6, 1987

[51] Int. Cl.[4] .............................................. H01R 39/02
[52] U.S. Cl. ....................................... 439/11; 118/723; 427/39
[58] Field of Search ............................ 439/11; 427/39; 118/50.1, 620, 722, 723

[56] References Cited

U.S. PATENT DOCUMENTS

| 4,452,828 | 6/1984 | Namba et al. | 427/39 |
| 4,526,806 | 7/1985 | Haque et al. | 427/39 X |
| 4,616,597 | 10/1986 | Kaganowicz | 427/39 X |
| 4,620,913 | 11/1986 | Bergman | 427/39 X |

Primary Examiner—Eugene F. Desmond
Attorney, Agent, or Firm—Harry M. Weiss & Associates

[57] ABSTRACT

A pair of contacts are disposed in holes in a retaining member that pivots about a longitudinal centerline. Because the member pivots, the contacts are maintained in an abutting relationship with contacts of a semiconductor boat assembly.

15 Claims, 1 Drawing Sheet

U.S. Patent  Jun. 28, 1988  4,753,598

PIVOTING ELECTRICAL CONTACT

BACKGROUND OF THE INVENTION

1. Field of the Invention

This invention is in the field of semiconductor wafer processing and, more particularly, relates to providing an electrically conductive path from a source of radio frequency power to an assembly wherein a plasma field is maintained.

2. Description of the Prior Art

A plasma enhanced vapor reactor is typically used in a deposition process for coating a semiconductor wafer. Usually, a plurality of semiconductor wafers are serially arranged within what is known as a semiconductor wafer boat assembly. During the process, the boat assembly is maintained in a tube where the temperature is elevated and gas reactants are passed.

An essential feature of the process is the establishment of a plasma field near the wafers. The field is established by providing an radio frequency voltge to electrodes of the boat. The leads that connect to the electrode, as well as supporting structures, are usually sheathed in a ceramic to prevent an undesired plasma field along the leads and the supporting structures.

Typically, the boat includes a pair of contacts that are connected via the leads of a source of radio frequency power. The source is external to the tube. Usually, the leads have contact surfaces that are maintained in an abutting relationship with the boat contacts. Attempts have been made to maintain the abutting relationship through the use of springs. However, because of the elevated temperature, the springs anneal and become useless.

Heretofore, there has not been an economical and reliable apparatus that provides a connection to the boat contacts.

SUMMARY OF THE INVENTION

An object of the present invention is to provide a reliable electrically conductive path between a source of radio frequency power and contacts of a semiconductor boat assembly.

According to the present invention, a contact retaining member pivots about a centerline thereof. The retaining member retains a pair of electrical contacts on opposite sides of the centerline.

The present invention includes a pivoting contact retaining member that provides a reliable electrical connection to contacts of a semiconductor boat.

Other objects, features and advantages of the present invention will be more fully understood from the following detailed description of the drawings and the preferred embodiment included herein.

DESCRIPTION OF THE PREFERRED EMBODIMENT

Figure 1:
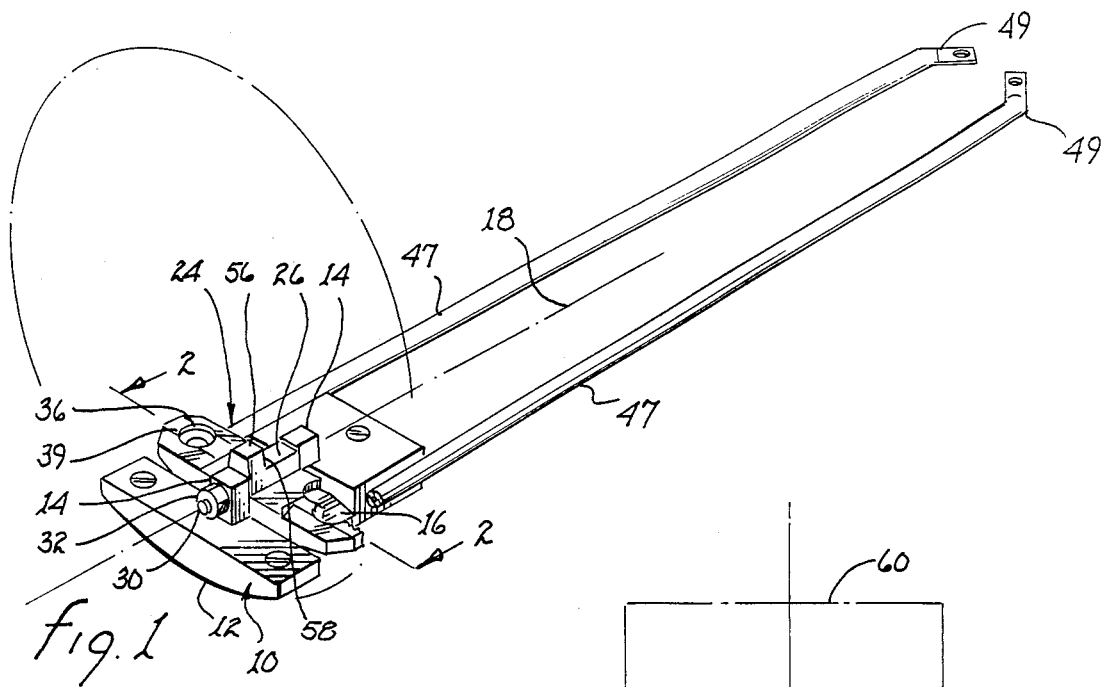
FIG. 1 is a perspective view, with a portion broken away, of the preferred embodiment of the present invention.

As shown in FIGS. 1-4, a ceramic base 10 has a cylindrically shaped bottom 12. The shape of bottom 12 is preferably complementary to the shape of a tube wherein base 10 is removably inserted. The top of base 10 has posts 14 that are spaced on opposite sides of a recess 16 (FIG. 1) in base 10. Moreover, posts 14 are disposed along a longitudinal centerline 18 that substantially divides base 10 in half. Posts 14 each have a cylindrical hole 20 (FIG. 3) therethrough and is coaxial with centerline 18. Holes 20 are explained hereinafter.

A ceramic contact retaining member 24 is disposd within recess 16. Integral with member 24 is a boss 26 that extends between posts 14 along centerline 18. Boss 26 has a cylindrical hole 28 (FIG. 3) therethrough that is coaxial with centerline 18.

Within holes 20, 28 is a ceramic pivot pin 30 that has ends that are threaded. Pin 30 is retained within holes 20, 28 by ceramic bolts 32 that threadedly engage respective ends of pin 30. Hence, member 24 may rotate like a teeter totter about pin 30.

Within member 24, on opposite sides of centerline 18, are countersunk holes 34 wherein contacts 36 are disposed with contact surfaces 38 that extend to the outside of holes 34. Contacts 36 have a cylindrical top portion 36a and a conical bottom portion 36b. Preferably, contacts 36 are made from either nickel or carbon.

Because member 24 may rotate like a teeter totter, when contacts of a semiconductor boat assembly are respectively placed upon contacts 36, member 24 rotates to provide an abutting relationship between the contacts of the boat and surface 38.

A threaded hole 39 (FIG. 4) extends through each of contacts 36 at substantially at right angles to axes thereof. Coaxial with holes 39 are holes 40 that extend through an end wall 42 (FIG. 3) of structure 24.

Contacts 36 are respectively connected to nickel rods 46 via threads on proximal ends 48 (FIG. 4) thereof that are engaged with holes 39, whereby rods 46 are brought into electrical contact with contacts 36. Rods 46 each carry a cylindrical ceramic sheath 47. The inside diameter of sheaths 47 is of a size that permits bending of rods 46.

Distal ends 49 of rods 46 are respectively connected to lugs 50. Lugs 50 are of a type that are suitable for fixed connection to a source of radio frequency power. Although lugs 50 are fixedly connected, the bending of rods 46 permits rotation of member 24.

Preferably, base 10 additionally has three threaded holes 52 wherein ceramic leveling screws 54 are carried. The leveling screws are selectively extended when the bottom of base 10 is not complementary to the tube referred to hereinbefore. The extending of the screws provides a stable support for base 10.

Figure 2:
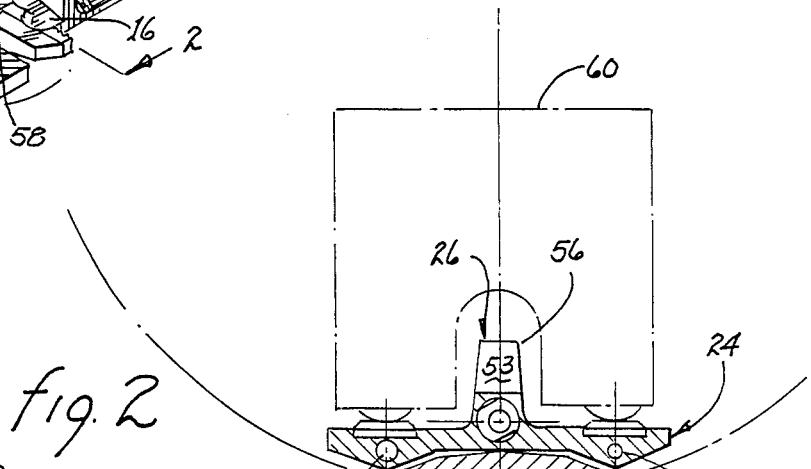
FIG. 2 is a sectional view of the embodiment of FIG. 1 taken along the line 2—2.
Figure 3:
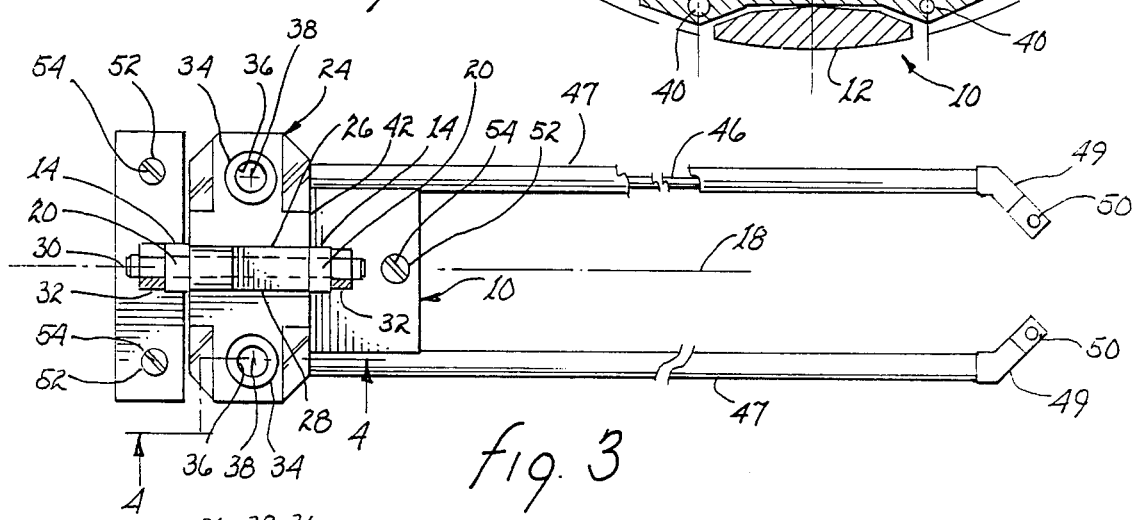
FIG. 3 is a plan view of the embodiment of FIG. 1.
Figure 4:
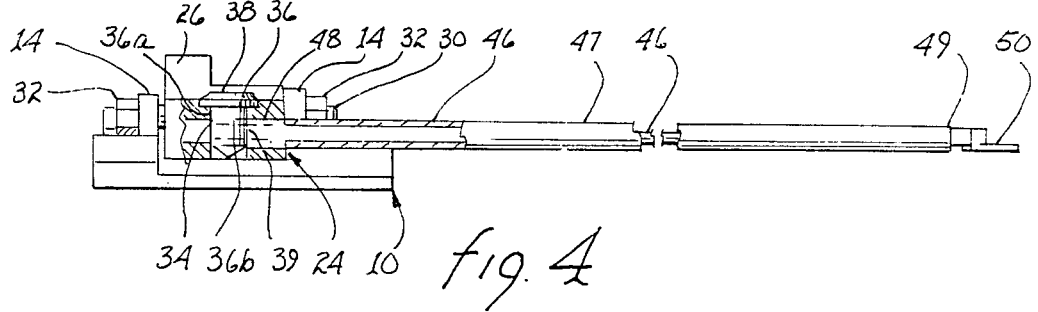
FIG. 4 is a sectional view of the embodiment of FIG. 3 taken along the line 4—4.

Preferably, boss 26 includes a portion 56 that provides a stop surface 58. Surface 58 may be brought to bear against an inside surface of an end 60 (FIG. 2, shown in broken lines) of the boat to prevent longitudinal movement of base 10.

It should be appreciated that base 10 and member 24 are made from ceramic, rather than metal, to provide an electrically insulating structure that inhibits unwanted plasma fields. For similar reasons, rods 46 carry sheaths 47.

While the invention has been particularly shown and described with reference to a preferred embodiment thereof, it is to be understood by those skilled in the art that changes in the form and detail may be made therein without departing from the spirit and the scope of the invention.

We claim:

1. Apparatus for providing an electrically conductive path from contacts of a semiconductor boat assembly, comprising:
    a base that is adapted for removable insertion within a reaction tube;
    a contact retaining member connected to said base to pivot about a longitudinal center line of said member;
    a pair of contacts connected to said member on opposite sides of said centerline; and
    means for connecting said contacts to a source of radio frequency power.

2. The apparatus of claim 1 wherein the bottom of said base has a shape substantially complementary to the shape of the interior of said tube.

3. The apparatus of claim 1 wherein said base has a recess wherein said member is disposed.

4. The apparatus of claim 1 additionally comprising a plurality of ceramic leveling screws that may be selectively extended from the bottom of said base.

5. The apparatus of claim 1 wherein said base is made from ceramic.

6. The apparatus of claim 1 wherein said contacts are disposed in countersunk holes through said member.

7. The apparatus of claim 1 wherein said contacts have a cylindrical top portion and a conical bottom portion with threaded holes that extend therethrough at right angles to the axes of said contacts.

8. The apparatus of claim 7 wherein said member has a pair of holes through an end wall, said contacts being alignable to cause said holes in said contacts to be respectively coaxial with said holes in said end wall.

9. The apparatus of claim 8 wherein said means comprise metal rods having a threaded end that is threadedly engageable within said holes in said contacts.

10. The apparatus of claim 9 wherein said rods are sheathed in ceramic.

11. The apparatus of claim 9 wherein said rods are made from nickel.

12. The apparatus of claim 1 wherein said member includes a boss with a stop surface that may be brought to bear against the inside surface of the end of said boat.

13. The apparatus of claim 1 wherein said member is made from ceramic.

14. The apparatus of claim 1 wherein said contacts are made from a material selected from the group consisting of nickel and carbon.

15. The apparatus of claim 1 wherein said base includes a pair of posts with holes therethrough and said member includes a boss with a hole therethrough, said holes being coaxial with said centerline, said connection of said member being via a ceramic pivot pin that passes through said holes.

* * * * *